United States Patent [19]

Gniewek et al.

[11] 4,135,998
[45] Jan. 23, 1979

[54] METHOD FOR FORMING PT-SI SCHOTTKY BARRIER CONTACT

[75] Inventors: John J. Gniewek, Wappingers Falls; Timothy M. Reith, Poughkeepsie; Michael J. Sullivan, Red Hook; James F. White, Newburgh, all of N.Y.

[73] Assignee: International Business Machines Corp., Armonk, N.Y.

[21] Appl. No.: 900,213

[22] Filed: Apr. 26, 1978

[51] Int. Cl.² .......................................... C23C 15/00
[52] U.S. Cl. .............................................. 204/192 E
[58] Field of Search ............... 204/192 E, 192 EC; 156/643

[56] References Cited

U.S. PATENT DOCUMENTS

| | | | |
|---|---|---|---|
| 3,642,548 | 2/1972 | Eger | 156/3 |
| 3,770,606 | 11/1973 | Lepselter | 204/192 |
| 3,855,612 | 12/1974 | Rosvold | 357/15 |
| 3,906,540 | 9/1975 | Hollins | 357/15 |
| 3,913,213 | 10/1975 | Mills et al. | 29/577 |
| 3,923,568 | 12/1975 | Bersin | 156/8 |
| 3,927,225 | 12/1975 | Cordes et al. | 427/84 |
| 3,956,527 | 5/1976 | Magdo et al. | 427/84 |
| 3,968,019 | 7/1976 | Hanazono et al. | 204/192 |
| 3,975,252 | 8/1976 | Fraser et al. | 204/192 |
| 3,995,301 | 11/1976 | Magdo | 357/15 |
| 4,082,637 | 4/1978 | Misiano et al. | 204/192 E |

OTHER PUBLICATIONS

J. J. Cuomo et al., "Selective Etch for Platinum Particular to Platinum Silicide Contact," IBM Tech. Disc. Bull., vol. 11, p. 1771 (1969).
A. L. Parker et al., "Removing Elemental Platinum from Silicon Deposits," IBM Tech. Disc. Bull., vol. 15, p. 2558 (1973).
M. Briska et al., "Producing a Schottky Contact by Annealing Pt and Cr Layers Deposited on an Si Substrate," IBM Tech. Disc. Bull., vol. 20, p. 1049 (1977).
T. M. Ruth et al., "Lift-Off Compatible All-Sputter Process," IBM Tech. Disc. Bull., vol. 20, pp. 4815–4816 (Apr. 1978).
L. Berenbaum et al., "Low Temperature In Situ Process for Schottky Barrier Diodes," IBM Tech. Disc. Bull., vol. 20, pp. 4384–4385, (Apr. 1978).

Primary Examiner—John H. Mack
Assistant Examiner—Aaron Weisstuch
Attorney, Agent, or Firm—Henry Powers

[57] ABSTRACT

Use of a rare gas in combination with oxygen or nitrogen to sputter etch unreacted platinum after formation of a platinum silicide contact structure for the formation of a Schottky Barrier diode in a silicon semiconductor substrate.

6 Claims, 8 Drawing Figures

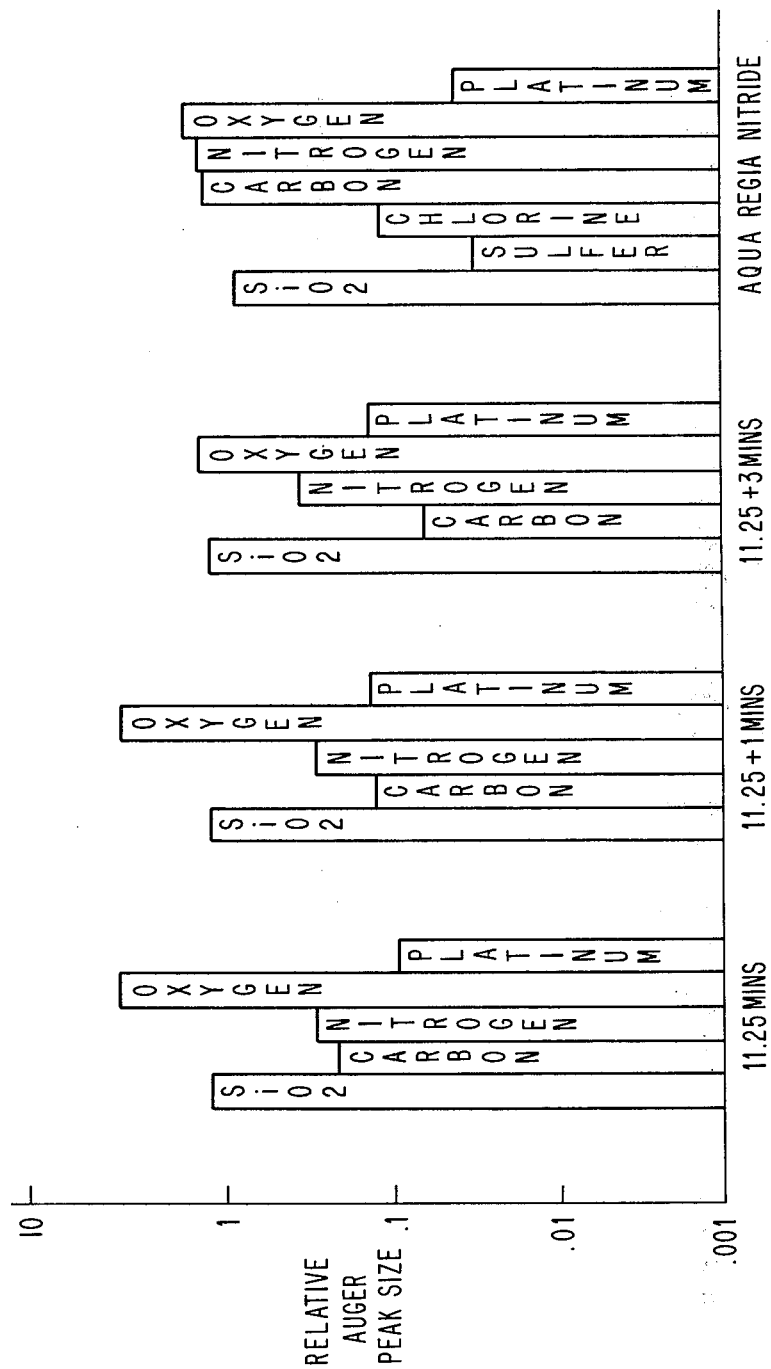

METHOD FOR FORMING PT-SI SCHOTTKY BARRIER CONTACT

DESCRIPTION

Technical Field

This invention relates to the selective etching of platinum in the presence of platinum silicide, and more particularly, to the use of this technique for the fabrication of platinum silicide contacts for formation of Schottky Barrier Diodes.

It is an object of this invention to provide a novel and improved method for the fabrication of Schottky Barrier Diodes.

Another object of this invention is to provide a new and improved method for the fabrication of platinum silicide contacts for Schottky Barrier Diodes.

Another object of this invention is to provide a novel method of forming platinum silicide contacts for the fabrication of Schottky Barrier Diodes in integrated circuits.

A further object of this invention is to provide a novel method for the selective etching of platinum in the presence of platinum silicide.

A still further object of this invention is to provide a novel method for increasing the difference in the sputter etch rate of platinum relative to the sputter etch rate of platinum silicide.

The foregoing and other objects, features and advantages of the invention will be apparent from the following more particular description of preferred embodiments of the invention as illustrated in the accompanying drawings.

BACKGROUND ART

The present invention relates to Schottky Barrier devices, and more particularly to Schottky Barrier devices which are readily integratable into integrated semiconductor circuits.

Surface barrier devices utilizing the Schottky effect based upon the rectifying characteristics exhibited by a metal-to-semiconductor interface are well known. Schottky Barrier diodes also called "hot carrier" diodes have been recognized to exhibit fast switching speeds as well as relatively low forward barrier or turn-on voltages. Accordingly, the desirability of utilizing Schottky Barrier devices in integrated monolithic circuits has been recognized in the art. The two most desirable uses of Schottky Barrier diodes have been purely as clamps or shunts across PN semiconductor junctions as well as for storage purposes in Schottky Barrier diode monolithic memory array integrated circuits. The primary advantage of Schottky Barrier diodes over other diodes has been their relatively low forward barrier characteristics. Because of such low forward barrier characteristics, Schottky Barrier diode clamps may be used to prevent transistor saturation and thereby to provide faster turn-off time for digital circuitry, and faster switching speeds. Also, such diodes require less voltage when used in memory arrays, thereby having minimal heat and power dissipation problems.

One extensively used metallurgy for providing the ohmic contacts and interconnections in present integrated circuitry involves the use of a layer of platinum silicide in the contact holes making direct contact with the silicon substrate and a layer of aluminum over the platinum silicide. This layer of aluminum is coextensive with an aluminum layer pattern on the insulative layer over the semiconductor substrate which provides the interconnections. The reason that platinum silicide has been used in the contact holes is that aluminum has been found to make less than satisfactory direct ohmic contacts with silicon semiconductor substrates.

While such composite metallurgies of aluminum layers over platinum silicide have been extensively used in integrated circuits involving ohmic contacts and even suggested for usage in circuitry involving both ohmic and Schottky Barrier contacts (see U.S. Pat. No. 3,506,893), problems have been encountered in the fabrication.

Generally, in the process of forming the platinum silicide contacts, a relatively thin layer of a patterned dielectric or insulating film on a silicon semiconductor substrate is provided with contact openings in those areas where a Schottky Barrier diode is to be formed. A thin layer of platinum is deposited over the entire surface by any conventional deposition technique, such as vapor deposition or preferably sputtering. On short term heat treatment, the platinum in the contact holes combines with the silicon to form the platinum silicide. The uncombined platinum layer is then removed so as to retain the platinum silicide in the contact holes.

Although the sputter etching of platinum has been known heretofore (see for example U.S. Pat. Nos. 3,271,286 and 3,975,252), due to the similar sputter etch rates for platinum (about 95Å/min.) and platinum silicide (about 80Å/min.), removal of the uncombined platinum has been conventionally effected by wet etching with etchants such as aqua regia. (See U.S. Pat. Nos. 3,271,286, 3,855,612, 3,956,527, 3,968,272 and 3,995,301).

Drawbacks of such etchants are the prospect of contamination by the various etchants, lack of any substantial differentiation in etching rates of the platinum and its silicide, as well as associated handling in rinsing and drying operations.

It has been discovered in accordance with this invention that substantially increased differentiation of the sputter etch rate of platinum can be obtained relative to the sputter etch rate of platinum silicide by effecting the sputter etching in an ambient of a rare gas containing at least 1% by volume of oxygen or nitrogen, and preferably an ambient of argon containing 10% by volume of oxygen.

BRIEF DESCRIPTION OF DRAWINGS

In the accompanying drawings forming a material part of this disclosure:

FIG. 3 is a bar graph illustrating relative peak size readings of material remaining on a substrate, after etching, with a scanning Auger microprobe.

DISCLOSURE OF INVENTION

For further comprehension of the invention, and of the objects and advantages thereof, reference will be made to the following description and accompanying drawings, and to the appended claims in which various novel features of the invention are more particularly set forth.

Figure 1A:
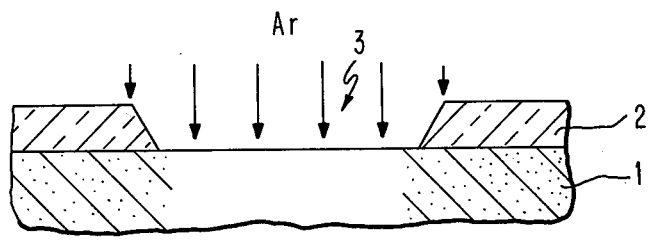
FIGS. 1A to 1F are diagrammatic, cross-sectional views of a portion of an integrated circuit encompassing a Schottky Barrier structure for purposes of illustrating the various steps in the fabrication thereof.
Figure 1B:
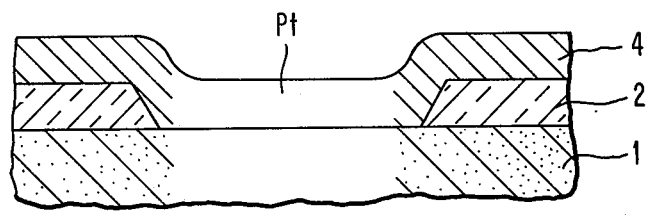
Figure 1C:
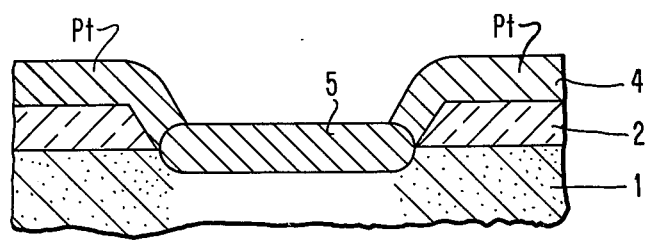
Figure 1D:
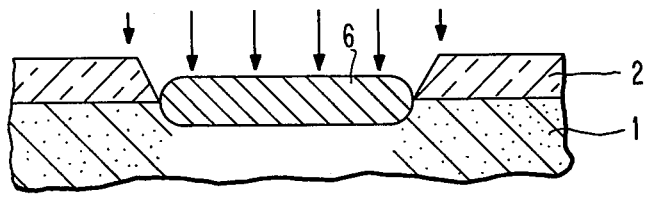
Figure 1E:
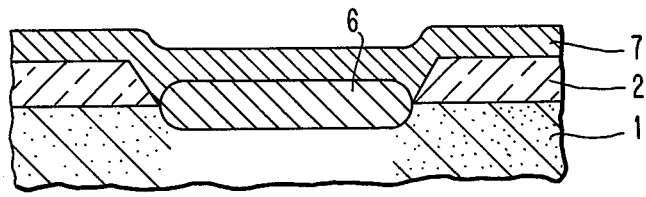
Figure 1F:
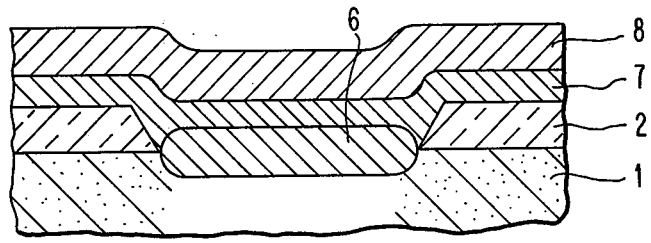

In FIG. 1A there is shown in cross-sectional view, a portion of a thin film integrated circuit at a suitable processing stage for the utilization of this invention. The semiconductor substrate 1 having a relatively thin layer 2 of an insulating dielectric on its upper surface, would usually be silicon, covered partially with a silicon dioxide film patterned with an opening 3 to accommodate a platinum silicide Schottky Barrier contact. Although dielectric or insulating layer 2 has been indicated to be silicon dioxide, which may have a thickness of approximately 2500Å, for purposes of illustrating this invention, it is to be understood that the insulating layer may be any other dielectric insulative layer conventionally used in integrated circuits, e.g. silicon nitride, a composite of silicon nitride. In general, the structure of FIG. 1A may be formed by any of the processes known in the art for fabricating integrated circuit structures. e.g. the method described in U.S. Pat. No. 3,539,876.

For subsequent operations, the substrate (e.g. wafer) 1 was placed in the load lock of a MRC (Materials Research Corp.) model 822 Sputtersphere which is an RF(13MHz) diode sputtering system which has a load lock chamber with quartz heaters and a deposition chamber containing three different targets and a catcher plate for sputter etching.

After pumping down the load lock to $10^{-4}$ Torr, the substrates were transferred to the sputter chamber with its catcher plate in position for sputter etch cleaning.

To insure a clean silicon surface, the oxide and exposed silicon surfaces were sputter etched for 2½ minutes in a 5 micron ambient of argon at 100 watts, as illustrated in FIG. 1A. (This step can be omitted if the wafers are sufficiently clean before loading in the sputter system).

After completion of the cleaning operation, the catcher plate was rotated to bring a platinum target into position where 600Å of film 4 of platinum was sputter deposited in a 5 micron ambient of argon at 500 watts in a 2½ minute period over the entire surface of the insulating film 2 and in contact opening 3. The platinum coated wafer was then transferred to the load lock where it was sintered for 20 minutes at 550° C. at a pressure of $10^{-4}$ Torr. The sintering operation results in the combination of the platinum in contact opening 3 with the exposed silicon of substrate 1 to form the platinum silicide region 5 while the remainder of the platinum layer 4 remains unaffected, e.g. uncombined with silicon or insulating layer 2.

The sintered substrates were again transferred from the load lock into the sputter chamber and the catcher plate was rotated for sputter etching of the uncombined platinum on the substrate. In the preferred embodiment, the uncombined platinum was etched over a 12 minute period at 100 watts under a 5 micron ambient of argon containing 10 volume percent of oxygen. It is to be understood that although argon has been illustrated in the sputter etch ambient, any gas can be employed which is completely inactive chemically with platinum, such as other rare gas members of the helium series which also include helium, neon, krypton, xenon and radon.

The removal of the unreacted or uncombined platinum, while leaving platinum silicide contact 6 in the contact holes is the key step of this invention. Since the reaction of platinum with silicon results in a platinum silicide layer 5 which is approximately twice as thick as the initial platinum layer, sputter etching in pure argon (in which platinum and platinum silicide etch at about the same rate, e.g. about 95Å/min. and 85Å/min, respectively) will result in a final platinum silicide layer approximately as thick as the initial platinum layer. For example, 500Å of platinum yields approximately 1000Å of platinum silicide, and etching of the 500Å of uncombined platinum also removes about 500Å of platinum silicide which leaves 500Å of platinum silicide in the contact holes. Although acceptable contacts can be utilized from this procedure, nevertheless it is desirable to remove as little of the platinum silicide as possible.

It was found that the addition of oxygen to a rare gas (e.g. argon) sputter etch ambient slows the platinum silicide sputter etch rate relative to the platinum etch rate.

Figure 2:
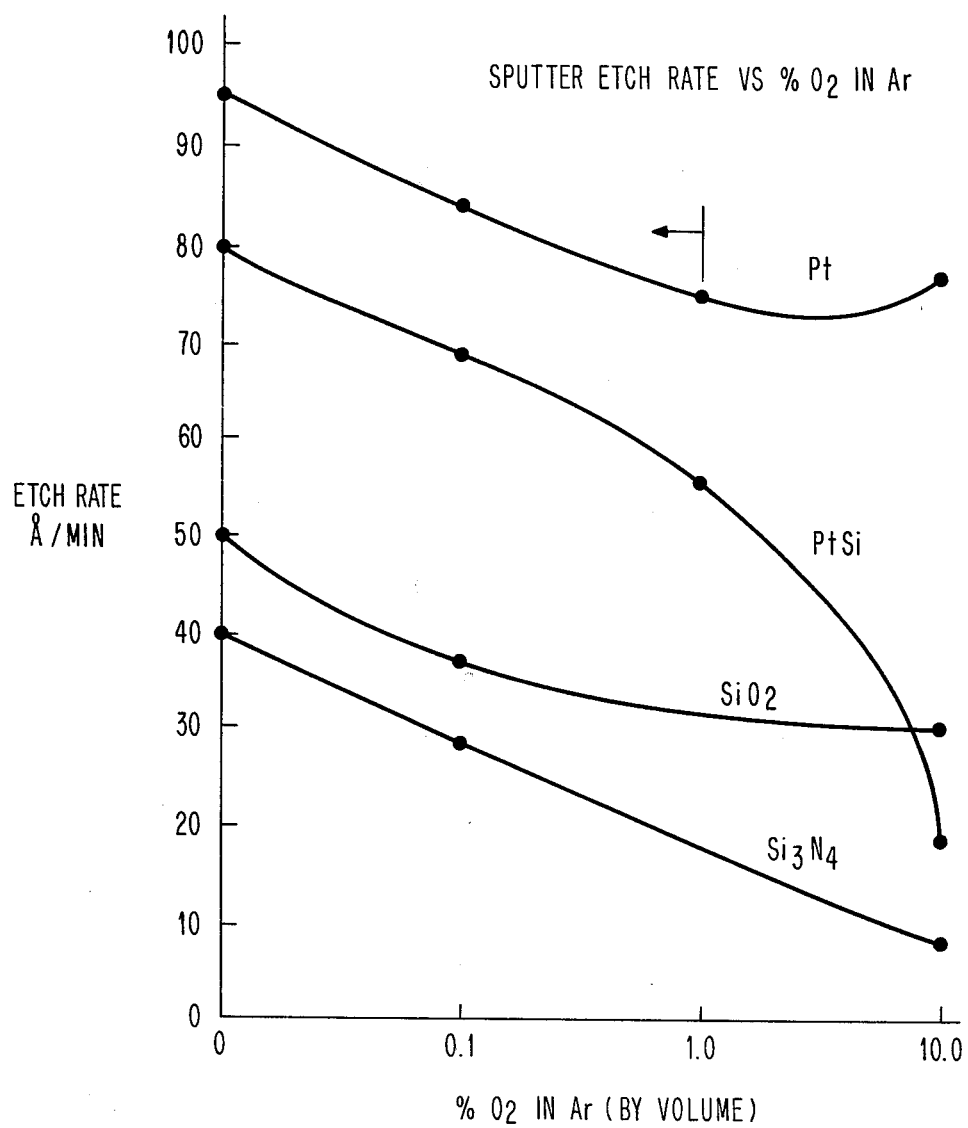
FIG. 2 is a graph illustrating the sputter etch rate of various materials relative to the oxygen content in an argon ambient.

Sputter etch rate determinations were made on blanket films of platinum (Pt), platinum silicide (PtSi), silicon dioxide ($SiO_2$) and silicon nitride ($Si_3N_4$) as a function of oxygen content in argon. The rates were determined by sputter etching masked samples for various times and measuring the material removed with the Taylor Hobson Talystep 1. FIG. 2 shows the results of two different sets of experiments. FIG. 2 shows that the addition of oxygen moderately reduces the etch rates of $SiO_2$, $Si_3N_4$ and Pt, whereas the etch rate of PtSi is sharply reduced to about ¼ that of the Pt etch rate in Ar + 10% $O_2$. As will be noted, the difference in the etch rates of Pt and PtSi begins to increase when the argon ambient contains about 1% of $O_2$ by volume.

As will be noted in FIG. 2, the PtSi etches at approximately the same rate as $SiO_2$ when the argon ambient contains about 10 volume percent of oxygen; and it is assumed that this is because the presence of 10 volume percent of oxygen in argon results in reactive sputtering in which $SiO_2$ forms on the surface of the PtSi and is then physically sputter etched. The $SiO_2$ does not form on the Pt surface because obviously, there is no silicon present in the platinum. Accordingly, it is believed that nitrogen, which is also combinable with silicon in reactive sputtering, can also be employed in the argon ambient during sputter etching of the uncombined platinum. Similarly, with use of nitrogen, silicon nitride will form on the platinum silicide by reactive sputtering, and then subsequently sputter etch removed.

With at least 1 volume percent of oxygen in the argon ambient, the final thickness of PtSi is greater. For example, with reference to the previous example (where 500Å Pt yields about 1000Å of PtSi), etching of 500Å of uncombined Pt, in an argon ambient containing 10 volume percent of oxygen, also removes approximately 125Å of PtSi leaving 875Å of the PtSi in the contact holes.

The presence of contamination on the substrates was also investigated as well as the effects of over sputter etching on the final PtSi thickness in the contact holes. For this purpose, five wafers with open contact holes were cleaned, 600Å of Pt was sputter deposited followed by sintering in vacuum in the load lock to form PtSi. One wafer was set aside as a control and another was etched for 20 minutes in freshly prepared aqua regia followed by a D.I. water rinse. The other three wafers were loaded in the sputter system and etched in Ar + 10% $O_2$, by volume, to remove uncombined Pt (e.g. for 11.25 minutes). One sample was removed from the system and the other two were sputter etched for one additional minute. One more sample was removed, and the last wafer was sputter etched for two additional minutes. All four etched samples were examined by a Physical Electronics Industries Inc. unit to determine the presence of surface platinum and other contaminants. The thickness of the PtSi in the contact holes was also determined using an Applied Research Lab. (ARL) electron microprobe. The results of the investigation are shown in FIG. 3, from which it can be determined that there was a little more Pt (approximately $10^{15}$ atoms/cm$^2$) left on the substrate surface of the Ar + 10% O$_2$ etched sample after 11.25 minutes as compared to the sample etched in aqua regia (approximately 4 × $10^{14}$ atoms/cm$^2$). The sample etched in aqua regia, however, was found to have significant chlorine and sulfur contamination which was not observed on the sputter etched sample, and also the carbon and nitrogen levels were greater on the aqua regia etched samples as compared to the sputter etched samples.

Over-etching, e.g. sputter etch, for one and three minutes in Ar + 10% O$_2$ had little effect except for a slight increase in platinum probably due to back sputtering from the substrate holder and reaction chamber walls.

The PtSi thickness in the contact holes, after etching is shown below:
1. Standard (no etch) — 1100Å
2. Aqua Regia — 1100Å
3. Ar + 10% O$_2$, 11.25 min. — 1030Å
4. Ar + 10% O$_2$, 12.25 min. — 970Å
5. Ar + 10% O$_2$, 14.25 min. — 970Å

The foregoing data shows that sputter etching of the platinum in an ambient of argon containing 10 volume percent of oxygen results in a slight thinning of the PtSi as compared to aqua regia etching, and over-etching (e.g. sputter) results in further thinning of the PtSi which is minor.

In general, it can be stated that, with regard to residual Pt, contamination and final PtSi thickness, the Ar + O$_2$ sputter etching compares very favorably with aqua regia etching.

After sputter etching of the uncombined platinum, the remainder of the Schottky Barrier diode (SBD) structure can be formed by any known technique (e.g. U.S. Pat. No. 3,906,540), or for example by the modified SBD process of U.S. Pat. No. 3,995,301.

Alternatively, the catcher plate, of the sputtering system, can be rotated to align a Titanium/Tungsten (Ti/W) alloy target with the substrate to sputter deposit a 1000Å film 7 of 10% Ti/90% W, by weight alloy over a 10 minute period in 5μ Ar at 500 watts. This Ti/W film 7 is employed as a diffusion barrier to prevent an applied film of aluminum from interaction with the platinum silicide. The excess portions of the Ti/W film 7 can be removed in any suitable manner, preferably sputter etching with a suitable mask.

In the final step, an aluminum/copper interconnection layer 8 of 8500Å thickness can be deposited from the fourth target of the sputtering system over a 30–60 minute period in 5μ Ar at 500 watts, if the interconnecting pattern definition is to be done by reactive ion etching. Alternatively for lift-off applications, where normal incidence deposition is required, the Ti/W coated wafers can be removed from the sputtering system, the Al/Cu film 8 (which is thick compared to the 1000Å Ti/W film 7 and the PtSi in the contact 6) would be vapor deposited, followed by conventional pattern definition.

While preferred embodiments of the invention have been illustrated and described, it is to be understood that this is not to be construed as a limitation to the precise construction herein disclosed and the right is reserved to all changes and modifications coming within the scope of the invention as defined in the appended claims.

Having described the invention, what is claimed as new, and desired to be secured by Letters Patent is:

1. In the sputter etching of platinum in the presence of platinum silicide the improvement comprising increasing the difference in the sputter etch rates of platinum over the silicide by sputter etching said platinum in an ambient of a rare gas containing at least 1% by volume of oxygen or nitrogen.

2. The method of claim 1 wherein said ambient comprises argon containing 10% of oxygen by volume.

3. In a method of forming a Schottky Barrier electrode in a silicon semiconductor substrate containing a plurality of active elements overcoated with an insulating layer containing at least one opening to a portion of said substrate, and a film of platinum over said layer which platinum is sintered with the silicon in said opening to form platinum silicide, the improvement comprising sputter etching the uncombined platinum in an ambient of a rare gas containing at least 1 volume percent of oxygen or nitrogen.

4. The method of claim 3 wherein said ambient comprises argon containing 10% of oxygen by volume.

5. A method of forming a platinum silicide contact for a Schottky Barrier diode in an integrated circuit contained in a silicon semiconductor substrate comprising
   forming a plurality of active circuit elements in a surface of a silicon semiconductor substrate,
   coating said surface with an insulating layer having at least one opening exposing said surface of said substrate,
   depositing a blanket layer of platinum on said insulating layer and in said opening in contact with said exposed surface portions of said substrate,
   sintering said platinum with the exposed portions of said silicon substrate in said opening to form platinum silicide therein, and
   sputter etching the uncombined platinum in an ambient of a rare gas containing at least 1% by volume of oxygen or nitrogen.

6. The method of claim 5 wherein said ambient comprises argon containing 10% of oxygen by volume.

* * * * *